(12) United States Patent
Wobben

(10) Patent No.: US 7,049,719 B2
(45) Date of Patent: May 23, 2006

(54) SYNCHRONOUS MACHINE

(76) Inventor: Aloys Wobben, Argestrasse 19, Aurich (DE) 26607

( * ) Notice: Subject to any disclaimer, the term of this patent is extended or adjusted under 35 U.S.C. 154(b) by 0 days.

(21) Appl. No.: 10/481,199

(22) PCT Filed: Jun. 6, 2002

(86) PCT No.: PCT/EP02/06182

§ 371 (c)(1),
(2), (4) Date: Jul. 15, 2004

(87) PCT Pub. No.: WO03/001649

PCT Pub. Date: Jan. 3, 2003

(65) Prior Publication Data

US 2004/0245868 A1    Dec. 9, 2004

(30) Foreign Application Priority Data

Jun. 20, 2001 (DE) .................... 101 29 365
Jul. 31, 2001 (DE) .................... 101 37 269

(51) Int. Cl.
H02K 7/06 (2006.01)
(52) U.S. Cl. ........................... 310/80; 310/184
(58) Field of Classification Search .......... 310/68 B, 310/68 D, 179–184
See application file for complete search history.

(56) References Cited

U.S. PATENT DOCUMENTS 2,871,434 A * 1/1959 Dauberman et al. ........ 318/713
3,025,443 A * 3/1962 Wilkinson et al. ......... 318/138
3,454,857 A * 7/1969 Farrand et al. ............. 318/701
3,873,897 A * 3/1975 Muller ...................... 318/138
4,164,705 A * 8/1979 Whitney et al. ............ 324/772
5,239,218 A * 8/1993 Hashimoto et al. ........ 310/68 B

FOREIGN PATENT DOCUMENTS

| DE | 2 248 902 | 4/1974 |
| DE | 31 27 372 A1 | 1/1983 |
| EP | 0 253 085 A1 | 1/1988 |
| EP | 0 787 996 A1 | 8/1997 |
| JP | 2001-346308 | 12/2001 |

* cited by examiner

Primary Examiner—Thanh Lam
(74) Attorney, Agent, or Firm—Seed IP Law Group PLLC

(57) ABSTRACT

The present invention concerns a synchronous machine with preferably salient poles with pole windings which are galvanically connected together. The invention further concerns a wind power installation and a method of monitoring a synchronous machine of a wind power installation. The object of the invention is to develop a synchronous machine and a method of operating a synchronous machine, such that the risk of a fire is reduced. A synchronous machine comprising a rotor which has a plurality of poles which are each provided with at least one respective pole winding, wherein the pole windings of a plurality of poles are galvanically connected together by means of a first conductor through which an exciter current flows, characterized in that laid substantially parallel to the first conductor is a monitoring conductor which is acted upon or which can be acted upon with a predeterminable signal, that the monitoring conductor is coupled or connected to a device for detecting the signal and that upon an interruption in the first conductor same is or can be detected by a signal variation in the monitoring conductor and the device for detecting the signal is coupled to a control device which then at least reduces and preferably switches off the exciter current through the first conductor.

6 Claims, 4 Drawing Sheets

SYNCHRONOUS MACHINE

BACKGROUND OF THE INVENTION

1. Field of the Invention

The present invention concerns a synchronous machine with preferably salient poles with pole windings which are galvanically connected together. The invention further concerns a wind power installation and a method of monitoring a synchronous machine of a wind power installation.

2. Description of the Related Art

Synchronous machines are generally known. One type of structure is forming either the rotor or the stator with (salient) poles, each pole having at least one pole winding through which an exciter current flows. That exciter current is always a direct current in synchronous machines.

In that respect the pole windings of all or a plurality of the individual salient poles are galvanically connected together. As however the pole windings are individually produced and fitted, that connection is implemented by suitable connecting means such as clamps, solder connections and so forth. In particular those connecting locations but also other locations at which for example the winding wire is damaged are subject to the risk of interrupting the galvanic connection, for example as a consequence of vibration in operation of the machine.

At that interruption, as a consequence of the high current strength, an arc can be formed, which increases the interruption by virtue of the removal of material and which thus itself also becomes greater and can become several centimeters long. In that respect there is the risk that material in the surroundings ignites and thus a fire occurs which destroys the machine.

BRIEF SUMMARY OF THE INVENTION

According to principles of the present invention, one object of the invention is to develop a synchronous machine and a method of operating a synchronous machine, such that the risk of a fire is reduced.

The galvanic connection of at least one of the pole windings is monitored and the exciter current is at least reduced upon an interruption in the galvanic connection. An interruption can be recognized in good time by virtue of monitoring of the galvanic connection. The reduction in the exciter current then prevents the production of an arc so that the risk of material in the surroundings catching fire is effectively reduced.

In a preferred embodiment of the invention the exciter current is completely switched off in order to be certain of extinguishing an arc which is possibly in existence. In that way, upon recognition of an interruption in good time, it is possible to reliably preclude the initiation of a fire by an arc.

In a particularly preferred development of the invention, for example in the case of groups of pole windings which are connected in parallel, only that group in which the interruption has occurred is switched off. That operating procedure provides that only the pole windings of that group are no longer supplied with current, but exciter current still flows through the other groups so that the synchronous machine can continue to operate.

In order to be able to recognize an interruption and in particular an arc in a simple fashion, a conductor which is closely adjacent to the galvanic connection is acted upon by a predeterminable signal and the presence of the signal is monitored. If an arc is produced, the adjacent conductor is also interrupted by that arc. In that way the signal is interrupted and the synchronous machine can be suitably controlled in accordance with the method of the invention.

In order for the mechanical structure to be of the simplest possible design configuration, it is possible to provide a conductor (monitoring conductor) which extends parallel to or in a helical configuration around the galvanic connection or which is wound around the galvanic connection or is mounted or glued thereto.

In a particularly preferred embodiment of the invention the monitoring conductor is an electrical conductor, for example a conventional insulated copper wire. This is inexpensively available and can be mounted in a simple fashion in accordance with the invention. In addition, when using an electrical conductor, it is possible for a predeterminable signal to be introduced, with a low degree of complication and expenditure. In an alternative embodiment the monitoring conductor is an optical conductor. In that case admittedly supplying the conductor with signals involves a higher degree of complication, but on the other hand the signals are insensitive in relation to electromagnetic influences and thus have a higher degree of freedom from interference.

In order to enhance the operational reliability of the method according to the invention and the synchronous machine, in particular a first apparatus for supplying the monitoring conductor with a signal and a second apparatus for monitoring the signal can be redundantly provided. In that way in the event of failure of a component the function thereof can be taken over by a redundantly present component.

BRIEF DESCRIPTION OF THE SEVERAL VIEWS OF THE DRAWING(S)

The invention is described in greater detail hereinafter with reference to the Figures in which.

DETAILED DESCRIPTION OF THE INVENTION

Figure 1:
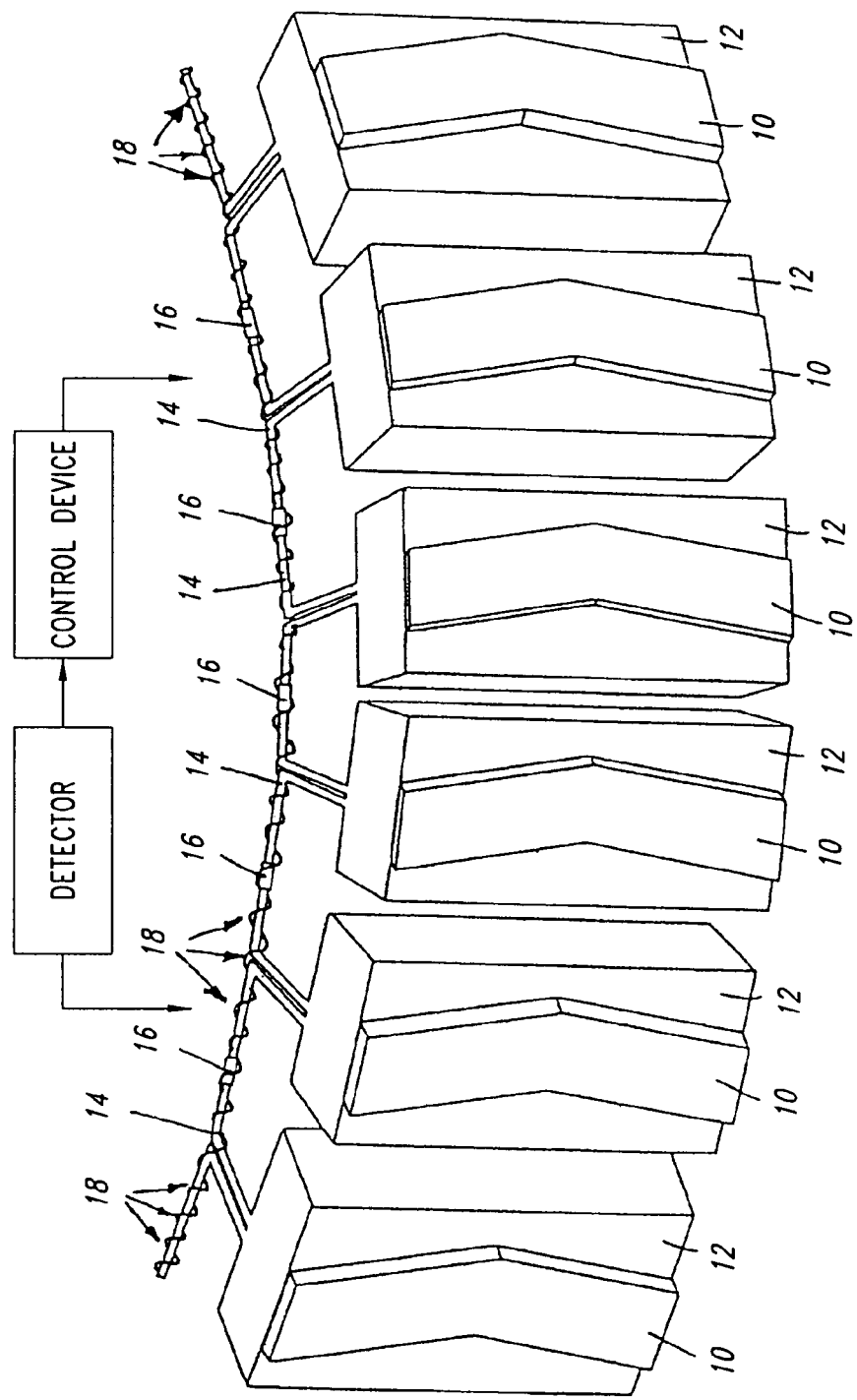
FIG. 1 shows a sector-shaped portion of a pole wheel.

FIG. 1 is a simplified view showing a section of a pole wheel of a synchronous machine such as a generator. Reference 10 denotes the individual pole pieces of the salient poles while reference 12 denotes the pole windings arranged on the salient poles.

Those pole windings 12 are connected together by a galvanic connection 14 so that the pole windings 12 are connected in series and thus all have the same current flowing therethrough. As the pole windings 12 are manufactured individually, the connections are connected together for example by connecting sleeves 16.

Figure 2:
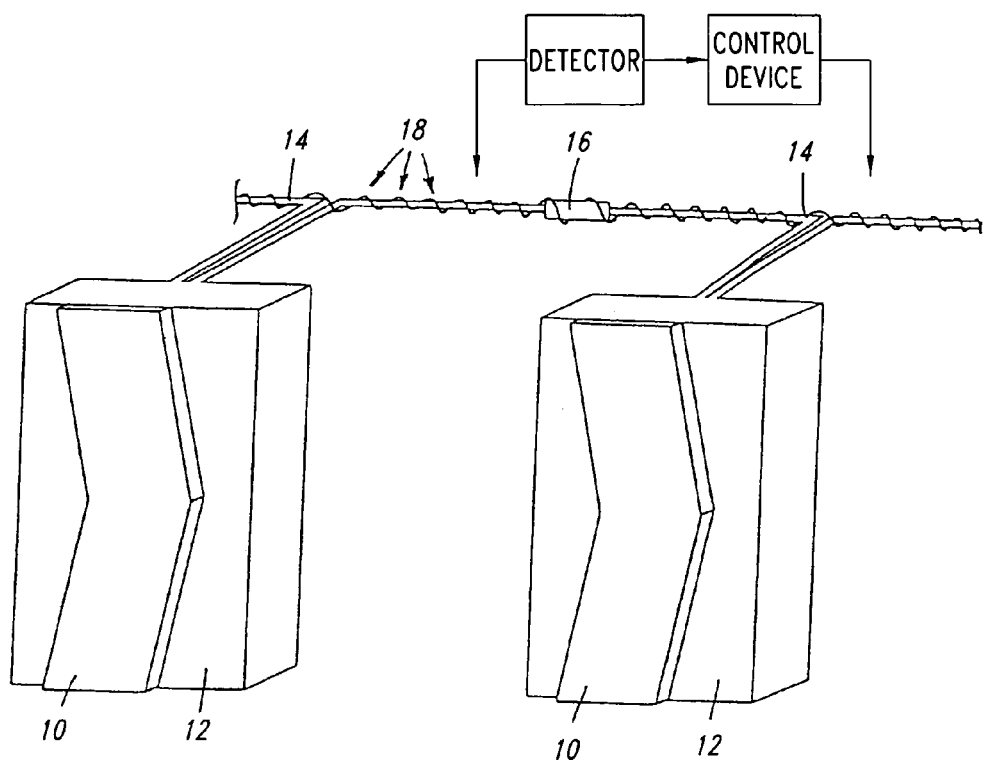
FIG. 2 shows a view on an enlarged scale of detail from FIG. 1.

FIG. 2 is a detail view on an enlarged scale from FIG. 1 and shows two pole pieces 10 with pole windings 12 arranged therebehind. Between the pole windings 12 there is a galvanic connection 14. That connection is made by the conductor 14 from which the pole winding 12 is wound being connected at a connecting location 16, for example with a connecting sleeve 16 or by a solder connection or by another suitable connection, to the conductor of the adjacent pole winding 12. Connecting locations 16 of that kind are also to be found in turn between the two pole windings 12 illustrated in this Figure and their respective adjacent (but not illustrated) pole windings 12. In particular however those connecting locations 16 are structural weak points in that galvanic connection 14 so that an interruption can occur there for example as a consequence of the vibration which occurs in operation of the synchronous machine.

Illustrated around the galvanic connection 14 and the connecting location 16 is a conductor 18 which is wound in a helical configuration, acting as a monitoring device or monitoring conductor.

If an interruption occurs for example due to vibration at the connecting location 16, an arc is formed there because the interruption is initially very small and the exciter current is relatively high. Material is removed by the arc and that causes the interruption to be increased in size. That removal of material by the arc however also interrupts the conductor 18 so that such interruption is detected by virtue of suitable monitoring of the conductor 18 and it is thus possible to conclude that the galvanic connection 14 is now interrupted and an arc has been formed. Thereupon it is possible to take suitable measures such as switching off the exciter current in order to extinguish the arc and thus to prevent the occurrence of a fire.

Figure 3:
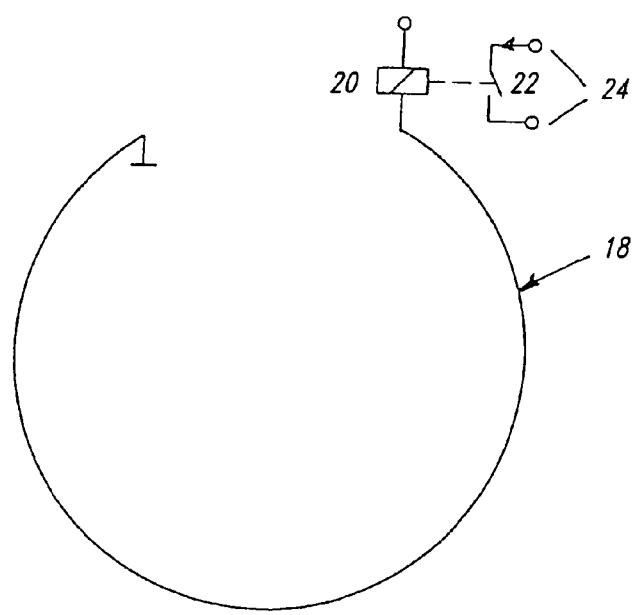
FIG. 3 shows a simplified view of a conductor in a first embodiment of the invention with an electrical conductor.

FIG. 3 is a view showing in simplified fashion a possible way of monitoring the situation with a conductor 18. The conductor 18 is at ground potential at one side. Provided at the other side of the conductor is a switching device 20, in this case a relay, which is supplied with a sufficient voltage so that it can pull up. That relay has an opening device 22 which is thus opened when the relay 20 is operated. If now an interruption in the conductor 18 occurs, the relay 20 is released and the opening device 22 closes. That closing action can be detected for example at the connecting terminals 24 by a downstream-connected device, and suitably evaluated.

It will be appreciated that the relay can also be arranged at the other side of the conductor 18. Then the conductor is supplied with a suitable voltage which causes the relay 20 to operate and in this case also the relay 20 is naturally released as soon as the conductor 18 is interrupted, which can lead directly to the exciter current being switched off.

Figure 4:
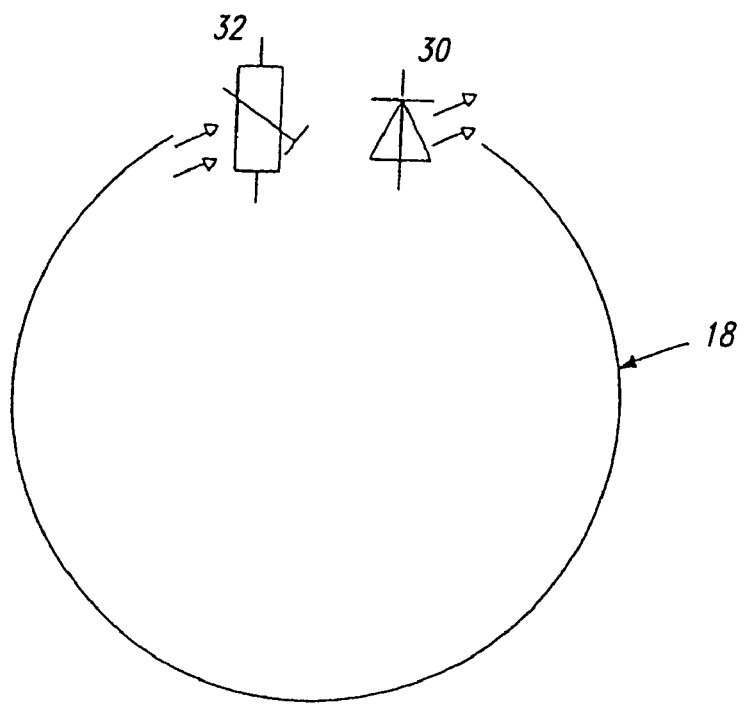
FIG. 4 shows an alternative embodiment of a monitoring system with an optical conductor.

FIG. 4 shows an alternative embodiment of the monitoring system illustrated in FIG. 3. The conductor 18 in FIG. 4 is a light wave conductor or optical fiber. An optical signal is coupled into the light wave conductor 18 by a light source 30, here illustrated in the form of a light emitting diode. At the other end, the optical signal is received by a receiver 32, in the present case a photoresistor, which in turn can be a component part of a bridge circuit.

Therefore as long as the light emitted by the light source 30 is transmitted through the conductor 18, the receiver 32 is of a given resistance. If there is an interruption in the conductor 18, then the light which is introduced from the light source 30 no longer reaches the receiver 32, the receiver 32 experiences a change in its resistance, and in that way the interruption in the conductor 18 can be recognized.

It will be appreciated that the receiver can also be for example in the form of a phototransistor or any other light-sensitive element.

Figure 5:
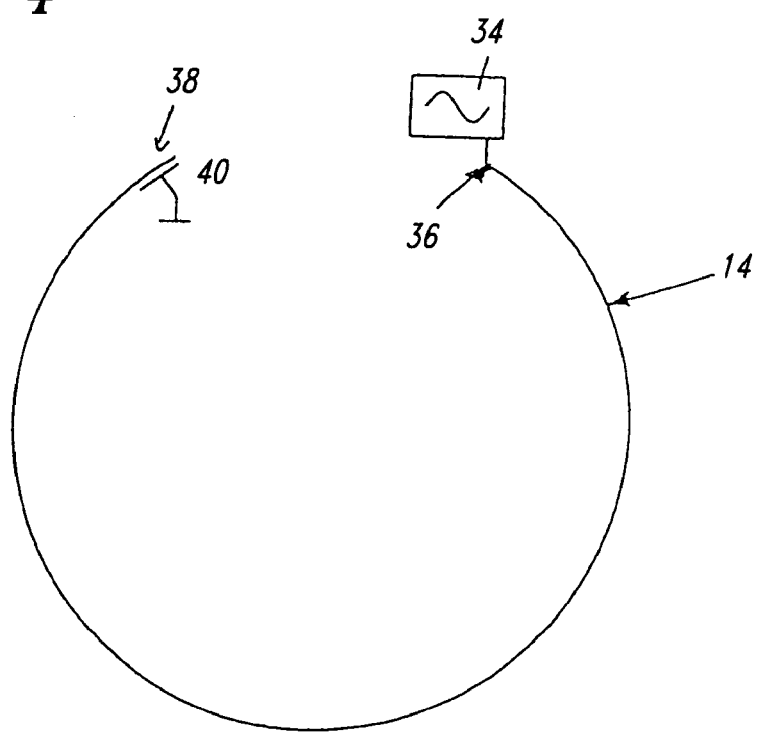
FIG. 5 shows a monitoring system without an additional conductor.

An alternative form of the system for monitoring the galvanic conductor 14 is shown in FIG. 5. In this case, at a coupling-in point 36, in addition to the flowing exciter current, an ac voltage of small amplitude and predetermined frequency is superimposed. That ac voltage is monitored at the coupling-out point 38. In this respect coupling-out can be effected for example capacitively or inductively. In that respect the Figure shows a plate 40 of a capacitor. The other plate can be formed for example by the galvanic connection 14 itself.

Once again the ac voltage which is coupled out by the capacitor 40 can be monitored by a suitable, downstream-connected circuit. If an interruption in the galvanic connection 14 occurs, the exciter current is admittedly still transported by the arc but the superimposed ac voltage is no longer so transported so that it can also no longer be coupled out at the coupling-out point 38. That makes it possible to detect the interruption in the galvanic connection 14.

If a plurality of pole windings are brought together to constitute a group and there are a plurality of groups of such pole windings, it is appropriate, for each group, to include its own specifically provided fuse wire so that, upon an interruption in the fuse wire, only the exciter current of the affected group is reduced or switched off so that the other groups can continue to be operated as usual in order to permit the generator to continue to operate.

If therefore each pole winding group has its own conductor 18, which is acting as a fuse wire, with the appropriate feed-in and monitoring device, that affords a clear association in respect of the pole winding group and the respective conductor 18 and actuation of the pole winding group can be suitably interrupted when the conductor 18 is severed. A further possible option involves using an individual conductor 18 for the pole winding of the entire pole wheel and switching off the exciter current in the case of an interruption in the fuse wire. When that interruption which must be maintained for a predetermined period of time in order to be certain of extinguishing the arc is reversed again, a suitable exciter current can flow again. Then only the pole winding group in which the interruption occurred is excluded therefrom. This arrangement however suffers from the disadvantage under some circumstances that the conductor 18 is then interrupted so that either the operation has to be continued without the conductor 18 or it cannot be continued for reasons of operational safety.

Figure 6:
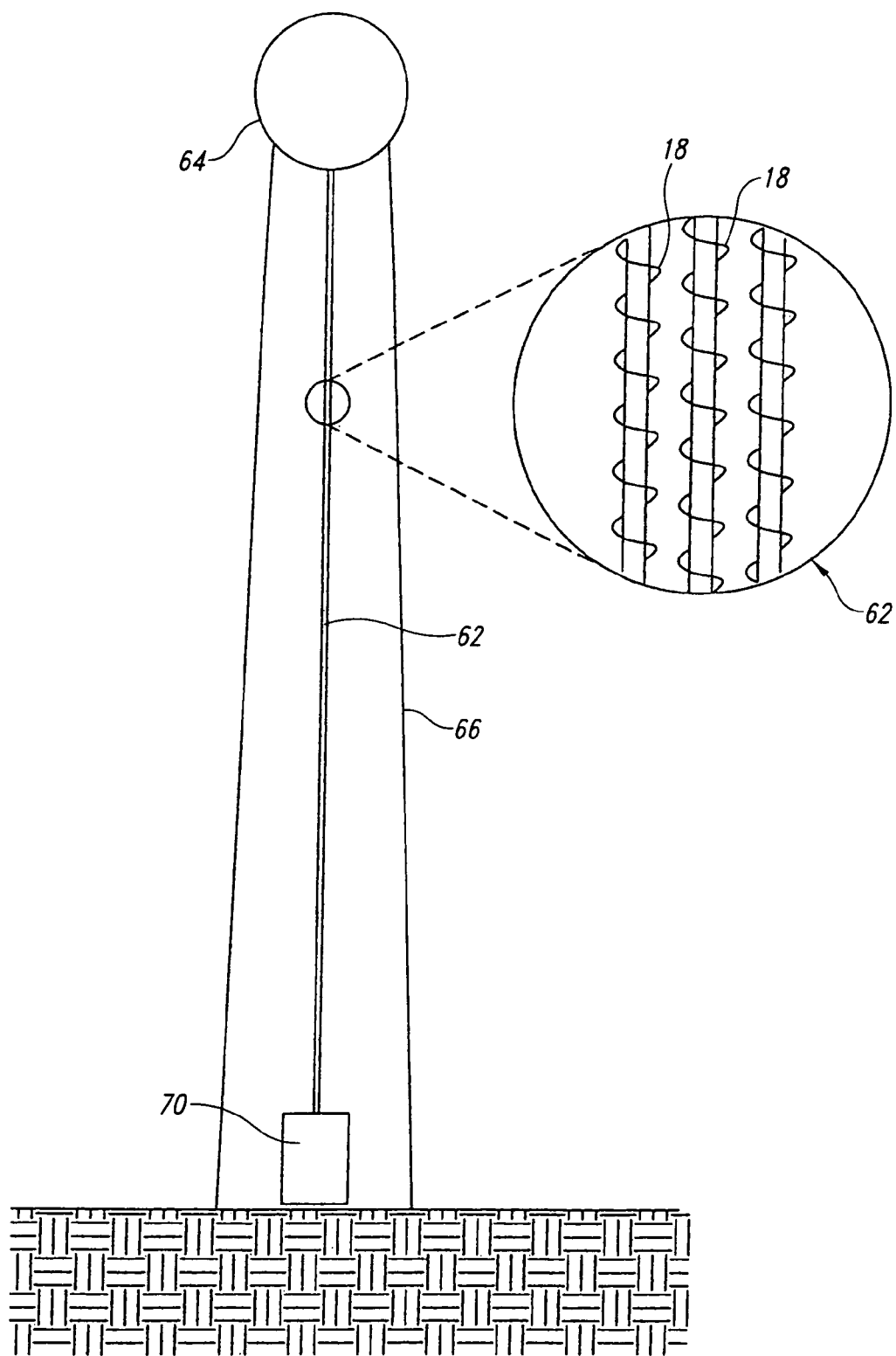
FIG. 6 shows a view of a wind power installation with a current bus bar around which is wound a fuse wire.

FIG. 6 illustrates that the invention is not limited for example just to monitoring the generator of the wind power installation, but can also be applied to other parts of the wind power installation. Thus for example the problem of arc formation occurs not only upon an interruption in the pole windings, but can also occur upon an interruption in the direct current bus bars 62 with which the electrical energy generated by the generator is passed from the machine pod 64 to the power switchboard cabinets which are usually arranged at the base of the pylon 66 or outside the pylon. The current bars 62 in the illustrated example serve as usual to pass the electrical power from the generator in the pod 64 of the wind power installation to the base of the pylon or the electrical devices disposed there such as inverters and/or transformers 70. Those direct current bus bars 62 usually consist of a metal, for example aluminum, and are fixed at the interior of the pylon 66 to the wall thereof and taken downwardly therein. As the pylon 66 also moves by virtue of the overall wind loading on the wind power installation (in the region of the pod 64 that movement can easily be of an amplitude in the range of between 0.5 m and 2 m), the current bus bars 62 are also correspondingly moved and loaded, which in the worst-case scenario, if the movements were too great or if the current bus bars 62 were not cleanly routed, can result in an interruption in the current bus bars 62, whereby an arc can also be formed between the separated parts and as very high flows of energy are to be found at that location, that can lead to very severe damage to the wind power installation, especially as it is also certainly possible for the arc which is produced to jump back to the grounded pylon 66 so that the outbreak of a fire also cannot be excluded.

The structure illustrated in FIG. 6 shows a view illustrating part of a three-wire current bus bar 62 being wrapped with a conductor 18, acting as a fuse wire, in which respect it is possible to use the monitoring devices shown in FIGS. 3 through 5 for monitoring the fuse wire. If the interruption occurs in a current bus bar, that also results in an interruption in the conductor 18 and in such a case the entire installation is shut down and is not further operated, for self-protection purposes, especially as in any case then the current bus bars 62 must not only be repaired but under certain circumstances also have to be replaced in order to guarantee reliable continuation of operation thereafter.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A synchronous machine comprising:
   a rotor which has a plurality of poles which are each provided with at least one respective pole winding, wherein the pole windings of a plurality of poles are galvanically connected together by means of a first conductor through which an exciter current flows, characterized in that laid substantially parallel to the first conductor is a monitoring conductor which can be acted upon with a predeterminable signal, that the monitoring conductor is coupled to a device for detecting the signal, and that an interruption in the first conductor can be detected by a signal variation in the monitoring conductor, wherein the device for detecting the signal is coupled to a control device which then reduces the exciter current through the first conductor.

2. A synchronous machine according to claim 1 characterized by a monitoring conductor extending in a helical configuration around the galvanic connection.

3. A synchronous machine according to claim 1 characterized in that the monitoring conductor is in the form of an electrical conductor.

4. A method of monitoring the operation of a synchronous machine which has a rotor which comprises a plurality of poles with a pole winding, wherein the pole windings of a plurality of poles are galvanically connected together and an exciter current flows through the pole windings, wherein there are provided means for monitoring the galvanic connection of the pole windings and upon an interruption in the galvanic connection the exciter current is reduced.

5. A method according to claim 4 characterized in that to recognize a galvanic interruption a monitoring conductor closely adjacent to the galvanic connection is acted upon by a predeterminable signal and the presence of the predetermined signal is monitored and upon a large change in the predetermined signal a control device is caused to reduce the exciter current.

6. The method according to claim 4 in which the exciter current is switched off.

\* \* \* \* \*